(12) United States Patent
Banister et al.

(10) Patent No.: US 8,887,023 B2
(45) Date of Patent: Nov. 11, 2014

(54) METHOD OF IDENTIFYING A CORRECT DECODING CODEWARD

(75) Inventors: Brian A. Banister, Moscow, ID (US); Patrick Owsley, Moscow, ID (US); Sean M. Collison, Meridian, ID (US)

(73) Assignee: Comtech EF Data Corp., Tempe, AZ (US)

( * ) Notice: Subject to any disclaimer, the term of this patent is extended or adjusted under 35 U.S.C. 154(b) by 466 days.

(21) Appl. No.: 13/269,347

(22) Filed: Oct. 7, 2011

(65) Prior Publication Data

US 2012/0026022 A1 Feb. 2, 2012

Related U.S. Application Data

(63) Continuation-in-part of application No. 12/729,027, filed on Mar. 22, 2010, now Pat. No. 8,473,798.

(60) Provisional application No. 61/161,843, filed on Mar. 20, 2009.

(51) Int. Cl.
*H03M 13/00* (2006.01)
*H03M 13/03* (2006.01)
*H03M 13/19* (2006.01)
*H03M 13/37* (2006.01)
*H03M 13/45* (2006.01)

(52) U.S. Cl.
CPC ............ *H03M 13/616* (2013.01); *H03M 13/19* (2013.01); *H03M 13/3776* (2013.01); *H03M 13/451* (2013.01); *H03M 13/6561* (2013.01); *H03M 13/6577* (2013.01)
USPC ............................ 714/758; 714/752; 714/795

(58) Field of Classification Search
CPC . H03M 13/451; H03M 13/25; H03M 13/616; H03M 13/29; H03M 13/41; H04B 7/06
USPC ......... 714/792, 795, 758, 776, 752, 746, 751, 714/755, 799, 786; 375/341, 262; 341/94
See application file for complete search history.

(56) References Cited

U.S. PATENT DOCUMENTS

| | | | | |
|---|---|---|---|---|
| 4,933,956 A | * | 6/1990 | Forney, Jr. ................... | 375/341 |
| 5,388,124 A | * | 2/1995 | Laroia et al. ................. | 375/286 |
| 5,832,044 A | * | 11/1998 | Sousa et al. ................. | 375/347 |
| 6,424,690 B1 | * | 7/2002 | Kay et al. ..................... | 375/377 |
| 2009/0019334 A1 | | 1/2009 | Tomlinson et al. | |
| 2009/0208120 A1 | | 8/2009 | Printz | |
| 2010/0114565 A1 | | 5/2010 | Kinns | |
| 2010/0146372 A1 | | 6/2010 | Tomlinson et al. | |

* cited by examiner

*Primary Examiner* — Phung M Chung
(74) *Attorney, Agent, or Firm* — Booth Udall Fuller, PLC (57) ABSTRACT

A method of searching for candidate codewords for a telecommunications system, the method comprising receiving a sequence of constellation points, producing a received FEC vector comprised of bits from the received constellation points, comparing the received FEC vector with a plurality of candidate codewords within a Dorsch decoding process using an ordered pattern, and terminating the search when a candidate codeword from among the plurality of candidate codewords is found residing within a predetermined range of a specified distance of the received FEC vector.

13 Claims, 5 Drawing Sheets

METHOD OF IDENTIFYING A CORRECT DECODING CODEWARD

CROSS REFERENCE TO RELATED APPLICATIONS

This document is a continuation in part of U.S. patent application Ser. No. 12/729,027 entitled "Encoding and Decoding Systems and Related Methods" to Banister et al., which was filed on Mar. 22, 2010, and claims the benefit of the filing date of U.S. Provisional Patent Application 61/161,843, entitled "Encoding and Decoding Systems and Related Methods" to Banister et al., which was filed on Mar. 20, 2009, the disclosures of which are hereby incorporated entirely herein by reference.

BACKGROUND

1. Technical Field

Aspects of this document relate generally to systems and methods for transmitting data across a telecommunication channel.

2. Background Art

In a telecommunication system, an encoded codeword of a linear block code may be sent across a noisy channel, such as a wireless communication link or other connection. Bits of the codeword may be initially assigned values of either −1 or 1 when first placed in the channel. As the bits travel across the channel, noise in the channel can increase or weaken the magnitude of a particular sent bit. On the receiving side, once the noisy codeword is acquired by the decoder, the codeword may be called a received vector. The decoder's purpose is to examine the received vector and find the codeword that was originally sent. Finding the originally sent codeword may involve a Euclidean squared distance calculation or correlation between the received vector and a collection of candidate codewords. The candidate codeword that is the least square distance (Euclidean distance) from the received vector or possesses the largest correlation with the received vector is generally selected as the most likely codeword that was sent.

SUMMARY

Implementations of a method of searching for candidate codewords for a telecommunications system may comprise receiving a sequence of constellation points, producing a received FEC vector comprised of bits from the received constellation points, comparing the received FEC vector with a plurality of candidate codewords within a Dorsch decoding process using an ordered pattern, and terminating the search when a candidate codeword from among the plurality of candidate codewords is found residing within a predetermined range of a specified distance of the received FEC vector.

Particular implementations may comprise one or more of the following features. The method may further comprise ordering the plurality of candidate codewords according to a probability that each of the candidate codewords will occur within the predetermined range of the specified distance of the received point. The method may further comprise sorting the received FEC vector according to a probability of reliability of each bit position of the received FEC vector. The method may further comprise generating one or more candidate codewords among the plurality of candidate codewords by creating one or more perturbations to one or more first bits of a base codeword of a sorted received FEC vector. The method may further comprise classifying a magnitude of each bit position as a logarithmic likelihood ratio (LLR) that is calculated as a logarithm of a probability that one received bit position has one sent value divided by a probability that the one received bit has a value opposite the one sent value. The method may further comprise quantizing the bit positions having a highest magnitude into a fixed number of levels using a uniform integer scalar quantizer.

Implementations of a method of searching for candidate codewords for a telecommunications system may comprise receiving one or more constellation points, mapping the received constellation points into a received FEC vector representing a point in an N-dimensional space determining whether a bit position in the codeword has a positive value or a negative value, determining whether a corresponding position element of the received FEC vector has a positive value or a negative value, comparing the bit position value with the corresponding position element value, re-mapping one or more position elements onto one or more planes of a hypercube surface, calculating a squared distance between the re-mapped received FEC vector and a candidate codeword, and terminating the search if the comparison of the values result indicates a confidence level of the one or more constellation points that is higher than a predetermined confidence threshold.

Particular implementations may comprise one or more of the following features. The method may further comprise mapping one or more received FEC vector elements to a codeword at a center of a region comprised of points that are less than a fixed square distance from the codeword.

Implementations of a method of searching for candidate codewords for a telecommunications system, may comprise removing a distance contribution of an element of an N-dimensional FEC vector from the N-dimensional vector when a comparison of values indicates that a bit position value and a corresponding position element value have a same sign and a magnitude of the FEC vector is greater than a value of one in a dimension and computing a distance from a candidate codeword by mapping the bit position in the codeword onto one or more planes of a hypercube surface wherein the hypercube surface contains codewords as vertices.

Particular implementations may comprise one or more of the following features. The method may further comprise mapping one or more position elements of the N-dimensional FEC vector to a codeword at a center of a region comprised of points that are less than a fixed square distance from the codeword.

Implementations of a method of searching for candidate codewords for a telecommunications system may comprise receiving a plurality of constellation points, producing a one or more received FEC vectors comprised of bits from the received constellation points, decoding the one or more received FEC vectors using a plurality of Dorsch decoders, comparing the one or more received FEC vectors with a plurality of candidate codewords within a Dorsch decoding process using an ordered pattern, releasing a best match codeword into an output buffer, and terminating the search when a codeword is found residing within a predetermined range of a specified distance of the one or more received FEC vectors.

Particular implementations may comprise one or more of the following features. The one or more received FEC vectors may comprise a unique identifier indicating an order in which the one or more received FEC vectors is received by the plurality of Dorsch decoders. The method may further comprise recording, by an ordering device, an order in which the one or more received FEC vectors is received by the plurality of Dorsch decoders. The method may further comprise simultaneously decoding two or more received FEC vectors using two or more decoders of the plurality of Dorsch decoders. The method may further comprise releasing by the output buffer to a downstream receiver, best match codewords in an order in which the codewords were received.

Implementations of a method of searching for candidate codewords for a telecommunications system may comprise receiving one or more constellation points, mapping the received constellation points into one or more received FEC vectors, each received FEC vector representing a point in an N-dimensional space, decoding the one or more received FEC vectors using a plurality of Dorsch decoders, determining whether a bit position in a candidate codeword has a positive value or a negative value, determining whether a corresponding position element of the one or more received FEC vectors has a positive value or a negative value, comparing the bit position value and the corresponding element position value, re-mapping one or more position elements onto one or more planes of a hypercube surface, calculating a squared distance between the re-mapped received FEC vector and the candidate codeword, and terminating the search if the bit position value and the corresponding element position value indicate a confidence level of the one or more constellation points that is higher than a predetermined confidence threshold.

Particular implementations may comprise one or more of the following features. Each of the one or more received FEC vectors may comprise a unique identifier indicating an order in which the one or more FEC vectors is received by the plurality of Dorsch decoders. The method may further comprise recording, by an ordering device, an order in which the one or more FEC vectors is received by the plurality of Dorsch decoders. The method may further comprise simultaneously decoding two or more received FEC vectors using two or more decoders of the plurality of Dorsch decoders. The method may further comprise releasing by the output buffer to a downstream receiver, best match codewords in an order in which the codewords were received.

Implementations of a method of searching for candidate codewords for a telecommunications system may comprise decoding one or more received FEC vectors using a plurality of Dorsch decoders, removing a distance contribution of a position element of an N-dimensional FEC vector from the N-dimensional FEC vector when a comparison of values indicates that a bit position value and a corresponding position element value have a same sign and a magnitude of the FEC vector is greater than a value of one in a dimension, and computing a distance from a candidate codeword by mapping the bit position in the codeword onto one or more planes of a hypercube surface wherein the hypercube surface contains codewords as vertices.

Particular implementations may comprise one or more of the following features. Each of the one or more received FEC vectors may comprise a unique identifier indicating an order in which the FEC vectors are received by the plurality of Dorsch decoders. The method may further comprise recording, by an ordering device, an order in which the one or more FEC vectors is received by the plurality of Dorsch decoders. The method may further comprise simultaneously decoding two or more received FEC vectors using two or more decoders of the plurality of Dorsch decoders. The method may further comprise releasing by the output buffer to a downstream receiver, best match codewords in an order in which the codewords were received.

Aspects and applications of the disclosure presented here are described below in the drawings and detailed description. Unless specifically noted, it is intended that the words and phrases in the specification and the claims be given their plain, ordinary, and accustomed meaning to those of ordinary skill in the applicable arts. The inventors are fully aware that they can be their own lexicographers if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. §112, ¶ 6. Thus, the use of the words "function," "means" or "step" in the Description, Drawings, or Claims is not intended to somehow indicate a desire to invoke the special provisions of 35 U.S.C. §112, ¶ 6, to define the invention. To the contrary, if the provisions of 35 U.S.C. §112, ¶ 6 are sought to be invoked to define the claimed disclosure, the claims will specifically and expressly state the exact phrases "means for" or "step for, and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. §112, ¶ 6. Moreover, even if the provisions of 35 U.S.C. §112, ¶ 6 are invoked to define the claimed disclosure, it is intended that the disclosure not be limited only to the specific structure, material or acts that are described in the preferred embodiments, but in addition, include any and all structures, materials or acts that perform the claimed function as described in alternative embodiments or forms of the invention, or that are well known present or later-developed, equivalent structures, material or acts for performing the claimed function.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, frequency examples, or methods disclosed herein. Many additional components and assembly procedures known in the art consistent with encoding and decoding systems and methods are in use with particular implementations from this disclosure. Accordingly, for example, although particular implementations are disclosed, such implementations and implementing components may comprise any components, models, versions, quantities, and/or the like as is known in the art for such systems and implementing components, consistent with the intended operation.

Implementations of a method of searching for candidate codewords in a Dorsch decoding process using an optimally ordered pattern are disclosed. A Dorsch decoder is unusual in that it is not necessary to know how to construct a decoder for a given code. The decoding is accomplished by using an encoder multiple times to iteratively search for the closest codeword to a received vector. Non-limiting examples of implementations of methods for terminating the search when a codeword is found residing within a specified distance of the received point are disclosed. In addition, various non-limiting examples of implementations of a method for selectively mapping the received point onto a one or more planes of one or more surfaces of a hypercube when computing the distance to a given candidate codeword are also disclosed. In implementations of encoding and decoding systems disclosed in this document and the appendix to the previously filed U.S. Provisional Patent Application No. 61/161,843, the disclosure of which was previously incorporated herein by reference, the various method and system implementations may serve to minimize the average number of codewords that will need to be evaluated during the decoding process, correspondingly impacting the speed (data rates) at which the decoder can be operated. Additionally, non-limiting examples of how multiple decoder instantiations can be interconnected to increase the overall throughput of the decoder are disclosed.

In implementations of a method of searching for the candidate codewords in a Dorsch decoding process using an optimal pattern and in implementations of a method of terminating the search when a codeword is found residing within a specified distance of a received constellation point, the collection of candidate codewords to test with the received vector can be generated in an ordered manner such that the probability of each successive codeword occurring is monotonically decreasing. This process enables the most probable codewords for matching to be checked first.

A codeword for an (n,k) linear block code will contain n bits, k of which can used to uniquely represent the original data that was to be sent (prior to being encoded into a codeword). These k bits can arbitrarily be copied to the first k bits of the encoded codeword, whereas the remaining n-k bits are parity bits, generated using the first k bits and an encoding process. When an encoded n-bit codeword is sent over a noisy channel, the magnitudes of each of the sent bit positions become either more or less confident. The received FEC vector can be sorted by the magnitude (or confidence) of each of its bit positions, with bits of the largest magnitude appearing first, and the bits with the least magnitude occurring last. In the sorted vector, the k most confident bits of the received FEC vector can now be treated as if they were the original user data that was sent and the n-k least confident bits can be treated as the parity bits during the candidate codeword generation and distance calculation and correlation process.

The process of generating candidate codewords requires creating perturbations to the first k bits (user data) of the base codeword of the sorted received FEC vector and then using the perturbations in the comparison process. The sorted received FEC vector may have a base codeword, represented by each of the k most likely bit positions being mapped to a −1 if the bit position value is less than 0, and 1 otherwise. The remaining n-k bit positions are generated as if a codeword was being encoded with the first k bits, but with a modified generation method. In implementations of encoding and decoding methods disclosed in this document, implementations of the methods include steps that determine how to choose a collection of the first k bit positions to use during perturbation of the base codeword to enable generation of new candidate codewords.

If the noise on the communication channel can be described as Additive White Gaussian Noise (although one having ordinary skill in the art would readily recognize that the noise may take any other form in various implementations), the magnitude of each of the received bit positions can be classified as an LLR (logarithmic likelihood ratio), describing the logarithm of the probability that one received bit position takes on one sent value versus the probability that the received position takes on the opposite value. The value of the LLR function monotonically increases for increasing received magnitudes. To introduce error patterns in a simple way, each of the k most reliable points in the received vector may be quantized to a fixed number of levels with a uniform integer scalar quantizer. Perturbation points may then be chosen if they are equal to a target LLR sum, or if any combination of the quantized points would reach that sum. A perturbation point may then have a hard decision value in the base codeword flipped and subsequently, a new codeword may be generated and tested using the perturbation point. If two points are included in a candidate codeword, the probability of both occurring simultaneously is described by the sum of each point's quantized magnitude. Accordingly, if the LLR sum starts at zero and increases by one only after all possible quantized magnitudes of the k most-reliable positions have been used to try to reach that sum, candidate codewords will be tried in decreasing order of probability of occurrence, to maximize the opportunity for a matching codeword to be found at the beginning of the evaluation. For the exemplary purposes of this disclosure, an example is provided illustrating a particular evaluation flow of selection of candidate codewords for a (7,4) Hamming code. In the example, the notation p1, p2, etc. represents a parity bit.

Received Vector: [1.1,−1.8,0.4,−0.3,1,0.4,−1.1]
Quantized Received Vector: [11,−18,4,3,10,4,−11]
Sorted Quantized Received Vector: [−18,11,−11,10,4,4,3]
Base Codeword: [−1,1,−1,1,p1,p2,p3]
The first k magnitudes of the sorted quantized received vector that are used to form the LLR sum: [18,11,11,10].
Evaluation of Target LLR for the following sum values:
1-9:
No perturbations can be made at these levels (1-9) since the sum is below any of the possible magnitudes.
10:
A single sum can be formed by using item 4 of the first k magnitudes in the perturbation. Thus the candidate codeword

[−1,1,−1,−1,p1,p2,p3] should be checked, where p1,p2,p3 are parity bits generated using the modified codeword generation method.

11:

Two different sums can be formed using either item 2 or item 3 of the first k magnitudes in the perturbation. Candidate codewords [−1,−1,−1,1,p1,p2,p3] and [−1,1,1,1,p1,p2,p3] are equally probable.

12-17:

No perturbations can be made at these levels (12-17) since no components can be combined to form these sums.

18:

A single sum can be formed by using item 1 of the first k magnitudes in the perturbation. Thus the candidate codeword [1,1,−1,1,p1,p2,p3] should be checked.

19-20:

No perturbations can be made at these levels (19-20) since no components can be combined to form these sums.

21:

Two different sums can be formed using item 4 and either items 2 or 3 of the first k magnitudes in the perturbation. The candidate codewords [−1,1,1,−1,p1,p2,p3] and [−1,−1,−1,−1, p1,p2,p3] are equally probable.

22:

A single sum at this level (22) can be formed using items 2 and 3 of the first k magnitudes in the perturbation forming the candidate codeword [−1,−1,1,1,p1,p2,p3].

The foregoing evaluation process may be continued until all possible candidate codewords have been generated or a fixed number of candidate codewords have been generated. If a candidate codeword is within a fixed squared distance of the received FEC vector, it can be deemed to be the codeword that was sent across the channel and no further codewords need to be tested or generated.

In implementations of a method for selectively mapping the received point onto a hypercube when computing the distance to a given candidate codeword, when a squared distance calculation is made between a received vector, r, and candidate codeword, c, a bit position (dimension) in the codeword, $c_i$, may have the same sign as the corresponding position (dimension), $r_i$, in the received vector r. If both points agree in sign for a given dimension, and the magnitude of r in that dimension is greater than 1, there is a distance contribution that may be referred to as being 'bad' in that dimension. This overly confident position is good for a correlation measurement between the two vectors but is undesirable for a squared distance calculation because the distance is contributed from a dimension that has a high probability of being correct.

Figure 1:
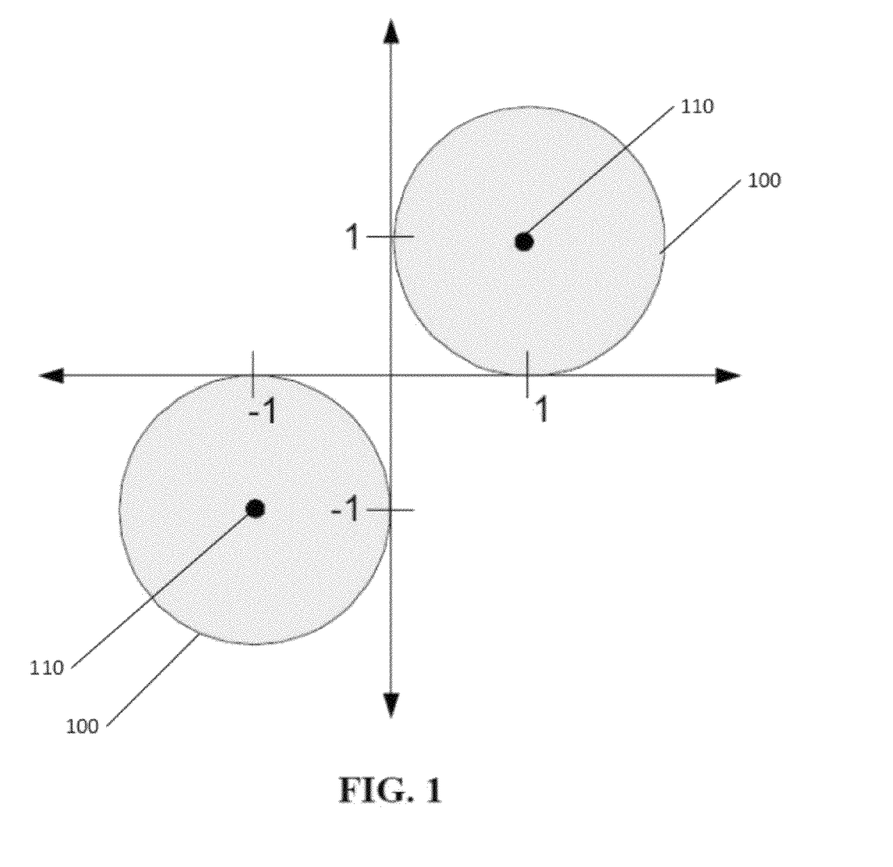
FIG. 1 is a graphic illustration of a locus of points shaded in gray that are less than a fixed square distance from a codeword.
Figure 2:
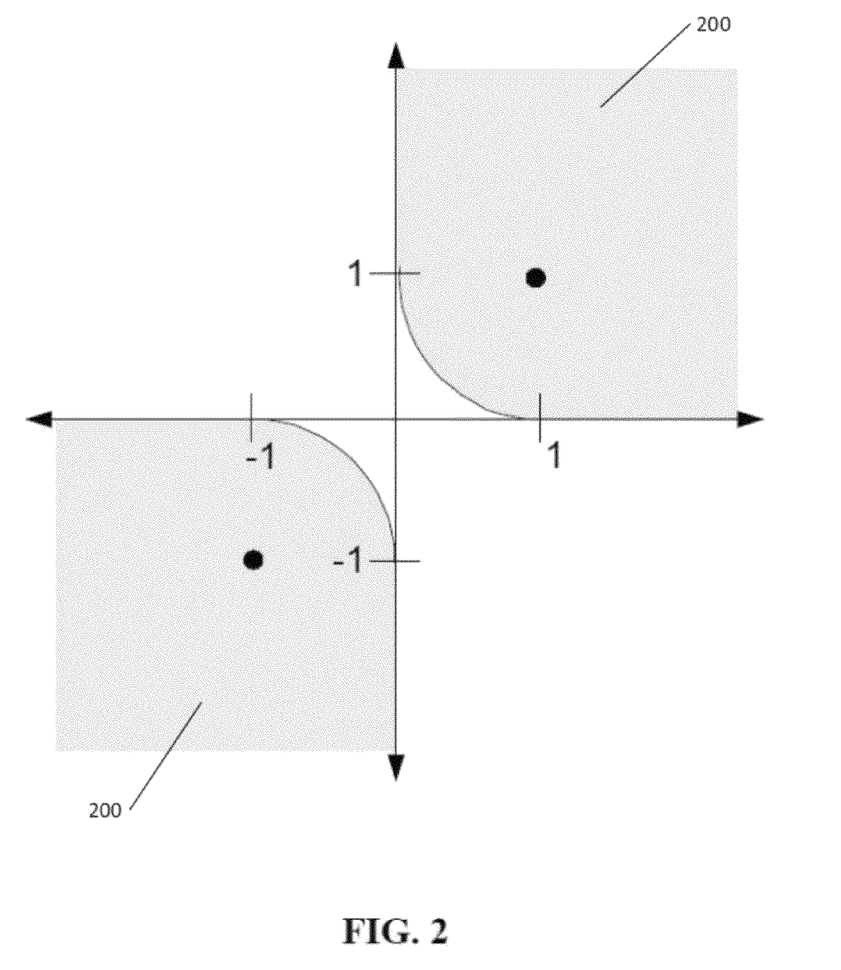
FIG. 2 is a graphic illustration of a new locus of points that would be less than a fixed squared distance from the codeword, with the bad distance removed.

In implementations of the method, the bad distance is not included if the sign of a received bit position matches the sign of the same bit position in the prospective codeword and the magnitude of the received bit position is greater than 1. This effectively maps bit positions made extra confident by noise back onto a hyper-cube containing codewords as vertices when computing the distance from the candidate codeword. FIG. 1 shows a locus of points shaded in gray 100 that are less than a fixed square distance from a codeword. Any received point in a gray region 100 maps to the codeword at the center of the region 110. FIG. 2 shows a new locus of points 200 that would be less than a fixed squared distance from the codeword, with the bad distance removed. Comparing FIG. 1 to FIG. 2, it is observed that FIG. 2 includes significantly more area than FIG. 1, permitting a candidate codeword to be deemed the codeword that was sent across the channel for significantly more received vectors. Moreover, there is no corresponding increase in the probability of falsely declaring a candidate codeword as the correct codeword when terminating the search process.

Figure 3:
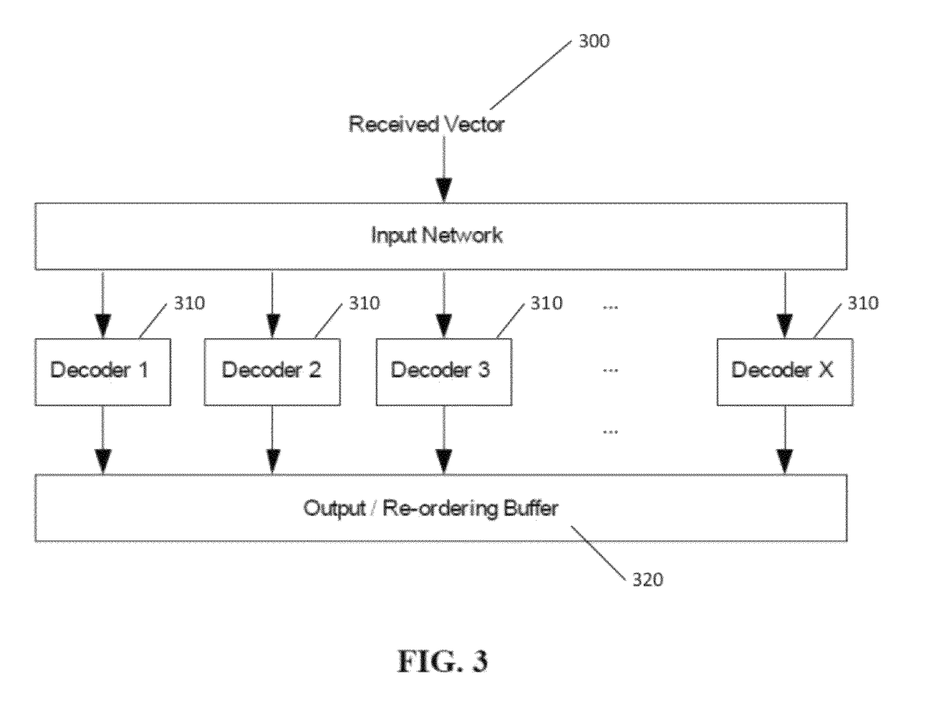
FIG. 3 is a block diagram of a particular implementation of a decoder network that includes multiple decoders.
Figure 4:
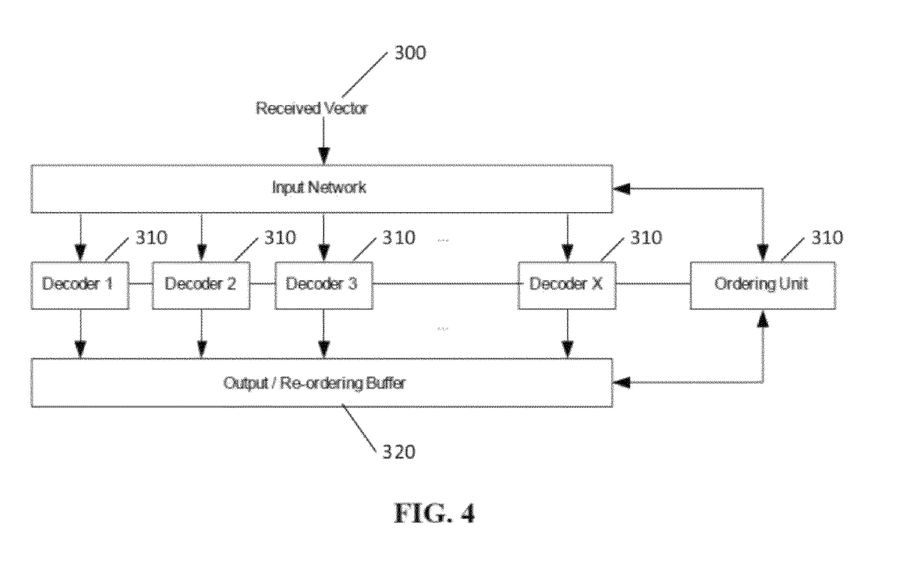
FIG. 4 is a block diagram of another particular implementation of a decoder network that utilizes a separate ordering unit to tabulate the order of the received vectors.

In implementations of a method of placing decoders like those disclosed in this document and in the appendix of U.S. Provisional Application No. 61/161,843 in an interconnected network, the overall decoding speed of a stream of received vectors may be increased. In an interconnected network, any individual decoder implementing the methods described in this document may be assigned any received FEC vector 300. Each decoder 310 will decode the assigned received FEC vector 300, and signal that decoding is complete, releasing the best match codeword into an output buffer 320. The output buffer 320, which can be of any size, may release best match codewords in the order they were originally received to a downstream receiver. The array of decoders 320 may permit one received FEC vector 300 to be worked on for an extended period of time, while still allowing other codewords to be simultaneously decoded. For exemplary purposes, FIG. 3 is provided to show how a particular implementation of a decoder network that includes multiple decoders 310 arranged to increase decoding speeds. As illustrated in the diagram, the decoders 310 keep track of a unique identifier for each received vector which allows each vector to be identified in the order it was received. FIG. 4 illustrates another implementation of a decoder network that utilizes a separate ordering unit to tabulate the order of the received vectors 300. Any of a wide variety of arrangements is possible.

Implementations of encoding and decoding systems and related methods may reduce the average number of codewords that will need to be evaluated during the decoding process, reduce the average number of codewords evaluated while not substantially increasing the risk of error despite significantly more received vectors possibly being deemed the codeword that was sent across the telecommunications channel without increasing the probability of a false identification, and significantly increase the speed at which the stream can be processed due to multiple decoders decoding a stream of received vectors.

Figure 5:
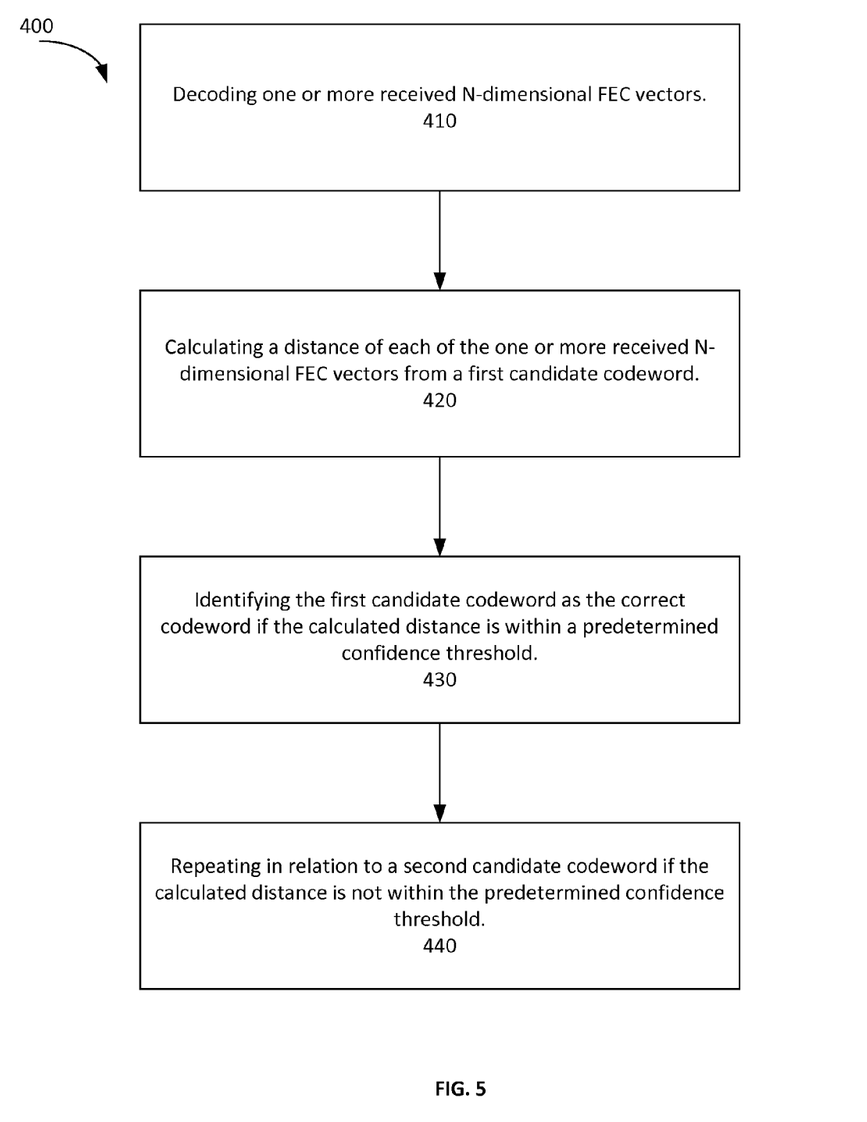
FIG. 5 is a block diagram of an implementation of a method of searching among a plurality of candidate codewords for a correct codeword.

FIG. 5 provides a block diagram of a method of searching among a plurality of candidate codewords (400) for a correct codeword in accordance with the above disclosure. As shown, one or more received N-dimensional FEC vectors may be received and decoded (410), for example using a plurality of Dorsch decoders. A distance of each of the one or more received N-dimensional FEC vectors to each of the plurality of codewords may be calculated to identify the codeword with the highest probability of being the correct codeword (420). When it is determined that a comparison of values indicates that a bit position value of a first candidate codeword of the plurality of candidate codewords and a corresponding bit position value of the received N-dimensional FEC vector have a same sign, and a magnitude of the at least one dimension of the received N-dimensional FEC vector is greater than a value of one, thereby indicating that this is a bad distance contribution, the distance may be calculated by creating a modified received N-dimensional FEC vector by removing a distance contribution of at least one dimension of a received N-dimensional FEC vector from among the decoded one or more received N-dimensional FEC vectors. This may be accomplished by mapping the bit position value in the received N-dimensional FEC vector onto one or more planes of a hypercube surface at a location that reflects the distance of the received N-dimensional FEC vector from the first codeword, wherein the hypercube surface contains one or more codewords as vertices. This may be accomplished by mapping the bit position value of the received N-dimensional FEC vector onto one or more planes of the hypercube surface at a location that reflects the removed distance contribution wherein the hypercube surface contains one or more codewords as vertices. Once the distance is calculated, the first candidate codeword is identified as the correct codeword if the calculated distance is within a predetermined confidence threshold (430). If the first candidate codeword is not within the predetermined confidence threshold, the process of calculating and identifying is repeated in relation to another candidate codeword and then another for all of the candidate codewords of the plurality of candidate codewords until a candidate codeword within the predetermined confidence threshold is identified.

The materials used for implementations of encoding and decoding systems may be made of conventional materials used to make goods similar to these in the art, such as, by non-limiting example, plastic, metals, semiconductor materials, and composites. Those of ordinary skill in the art will readily be able to select appropriate materials and manufacture these products from the disclosures provided herein.

The implementations listed here, and many others, will become readily apparent from this disclosure. From this, those of ordinary skill in the art will readily understand the versatility with which this disclosure may be applied.

The invention claimed is:

1. A method of searching among a plurality of candidate codewords for a desired codeword for a telecommunications system, the method comprising:
   decoding one or more received N-dimensional FEC vectors using a plurality of Dorsch decoders;
   creating a first modified received N-dimensional FEC vector by removing a distance contribution of at least one dimension of a first received N-dimensional FEC vector from among the one or more received N-dimensional FEC vectors when a comparison of values indicates that a bit position value of a first candidate codeword of the plurality of candidate codewords and a corresponding bit position value of the first received N-dimensional FEC vector have a same sign, and a magnitude of the first received N-dimensional FEC vector in the corresponding bit position value is greater than a value of one;
   computing a distance of the first modified received N-dimensional FEC vector from the first candidate codeword; and
   identifying the first candidate codeword as the desired codeword for the telecommunications system if the calculated distance is within the predetermined confidence threshold, and repeating the calculating and comparing steps in relation to a second candidate codeword of the plurality of candidate codewords if the first candidate codeword is not within the predetermined confidence threshold.

2. The method of claim 1, wherein each of the one or more received FEC vectors comprises a unique identifier indicating an order in which the received N-dimensional FEC vectors is received by the plurality of Dorsch decoders.

3. The method of claim 1, further comprising recording, by an ordering device, an order in which the one or more received N-dimensional FEC vectors is received by the plurality of Dorsch decoders.

4. The method of claim 1, further comprising simultaneously decoding two or more received N-dimensional FEC vectors using two or more decoders of the plurality of Dorsch decoders.

5. The method of claim 1, further comprising releasing by an output buffer to a downstream receiver, best match codewords in an order in which the codewords were received by the buffer.

6. The method of claim 1, wherein creating a first modified received N-dimensional FEC vector comprises mapping the bit position value in the received N-dimensional FEC vector onto one or more planes of a hypercube surface at a location that reflects the distance of the first received N-dimensional FEC vector from the first codeword, wherein the hypercube surface contains one or more codewords as vertices.

7. A method of searching among a plurality of candidate codewords for a desired codeword for a telecommunications system, the method comprising:
   calculating a distance between a received N-dimensional FEC vector and a first candidate codeword of the plurality of candidate codewords by determining if a magnitude of at least one dimension of the received N-dimensional FEC vector has a value greater than one, and a bit position value of the first candidate codeword and a corresponding bit position value of the received N-dimensional FEC vector have a same sign, and if the determination is true then creating a first modified received N-dimensional FEC vector by mapping the bit position value of the received N-dimensional FEC vector onto one or more planes of a hypercube surface at a location that reflects the distance between the received N-dimensional FEC vector and the first candidate codeword;
   comparing the calculated distance to a predetermined confidence threshold; and
   identifying the first candidate codeword as the desired codeword for the telecommunications system if the calculated distance is within the predetermined confidence threshold, and repeating the calculating and comparing steps in relation to a second candidate codeword of the plurality of candidate codewords if the first candidate codeword is not within the predetermined confidence threshold.

8. The method of claim 7, further comprising mapping one or more bit position values of the first modified received N-dimensional FEC vector to a codeword at a center of a region comprised of points that are less than a fixed square distance from the codeword.

9. The method of claim 7, wherein the hypercube surface contains one or more codewords as vertices.

10. The method of claim 7, wherein mapping the bit position value of the received N-dimensional FEC vector comprises removing a distance contribution of at least one dimension of a first received N-dimensional FEC vector from among the decoded one or more received N-dimensional FEC vectors.

11. A method of searching among a plurality of candidate codewords for a desired codeword for a telecommunications system, the method comprising:
   calculating a first distance between a first candidate codeword of the plurality of candidate codewords and a received N-dimensional FEC vector; and
   identifying the first candidate codeword as the desired codeword for the telecommunications system if the calculated first distance is below a predetermined confidence threshold, and calculating a second distance between a second candidate codeword of the plurality of candidate codewords and the received N-dimensional FEC vector if the first distance is above the predetermined confidence threshold, wherein calculating the first distance comprises:
- mapping a bit position value of at least one dimension of the received N-dimensional FEC vector onto a surface of a hypercube without a first distance contribution of the at least one dimension of the received N-dimensional FEC vector when a sign of the bit position value is the same as a sign of a corresponding bit position value of the first candidate codeword, and the magnitude of the bit position value of the first dimension of the received N-dimensional FEC vector has a value greater than one; and
- calculating the first distance between the first candidate codeword and the received N-dimensional FEC vector by calculating the first distance between the mapped bit position value of the received N-dimensional FEC vector and the bit position value of the first candidate codeword.

12. The method of claim 11, wherein identifying the first candidate codeword as the desired codeword comprises identifying the first candidate codeword as having the highest probability among the plurality of candidate codewords of being a codeword transmitted with a communication on the telecommunications system.

13. The method of claim 11, wherein identifying the first candidate codeword as the desired codeword comprises identifying the first candidate codeword as having the highest probability among the plurality of candidate codewords of being a codeword transmitted with a communication in the telecommunications system.

* * * * *